(12) United States Patent
Chang et al.

(10) Patent No.: US 7,636,018 B2
(45) Date of Patent: Dec. 22, 2009

(54) PHASE LOCKED LOOP WITH PHASE SHIFTED INPUT

(75) Inventors: Jen-Chung Chang, Taoyuan County (TW); Chia-Jung Hsu, Hsinchu (TW); Shey-Shi Lu, Taipei (TW); Yu-Che Yang, Taipei (TW); Tsung-Chien Wu, Hualien County (TW); Tzu-Chao Lin, Kaohsiung (TW)

(73) Assignees: United Microelectronics Corp., Hsinchu (TW); National Taiwan University, Taipei (TW)

( * ) Notice: Subject to any disclaimer, the term of this patent is extended or adjusted under 35 U.S.C. 154(b) by 477 days.

(21) Appl. No.: 11/686,092

(22) Filed: Mar. 14, 2007

(65) Prior Publication Data

US 2008/0224789 A1    Sep. 18, 2008

(51) Int. Cl.
    *H03L 7/00* (2006.01)
(52) U.S. Cl. .............................. 331/12; 331/11; 327/156
(58) Field of Classification Search ................... 331/11, 331/12; 327/156
    See application file for complete search history.

(56) References Cited

U.S. PATENT DOCUMENTS

| 5,408,200 | A  | * | 4/1995 | Buhler ........................ 331/1 A |
| 6,560,306 | B1 |   | 5/2003 | Duffy et al. |
| 6,603,360 | B2 |   | 8/2003 | Kim et al. |
| 6,901,126 | B1 |   | 5/2005 | Gu |
| 7,486,145 | B2 | * | 2/2009 | Floyd et al. .................. 331/1 A |

* cited by examiner

*Primary Examiner*—Arnold Kinkead
(74) *Attorney, Agent, or Firm*—J.C. Patents (57) ABSTRACT

In a phase locked loop (PLL), phase shifters shift a phase of an input signal. Based on the phases of the input signal, the shifted signals, and a frequency division output signal, phase frequency detectors (PFDs) generate phase difference signals. In response to the phase difference signals, charge pumps (CPs) control output voltages thereof. Based on the output voltages of the CPs, a voltage controlled oscillator (VCO) outputs an output signal. A frequency divider divides the frequency of the output signal from the VCO to generate the frequency division output signal. A circulator outputs the frequency division output signal to one of the PFDs at a proper timing. A modulator reduces quantization errors of the frequency divider.

19 Claims, 6 Drawing Sheets

PHASE LOCKED LOOP WITH PHASE SHIFTED INPUT

BACKGROUND OF THE INVENTION

1. Field of Invention

The present invention relates to a phase locked loop (PLL). More particularly, the present invention relates to a PLL employing a plurality of phase frequency detectors (PFDs) and charge pumps (CPs) to accomplish fractional frequency division.

2. Description of Related Art

In communication systems or computer systems, a PLL generates output clock signals having synchronizing rising edges (or falling edges) with an input reference clock signal.

Conventionally, the PLL includes a phase frequency detector (PFD), a charge pump (CP), a low-pass filter (LPF), a voltage controlled oscillator (VCO), and a frequency divider. The PFD compares the phase of an input signal with the phase of a frequency division signal fed back from the frequency divider so as to generate a control signal and provide the same to the CP. In accordance with the control signal, the CP determines if an output voltage of the CP is increased or decreased. The LPF is capable of filtering high frequency spurs of the output voltage of the CP. The VCO receives the filtered output voltage from the CP so as to generate an output signal. The frequency divider divides the frequency of the output signal from the VCO to generate the frequency division signal and transmits the frequency division output signal to the PFD.

Figure 1:
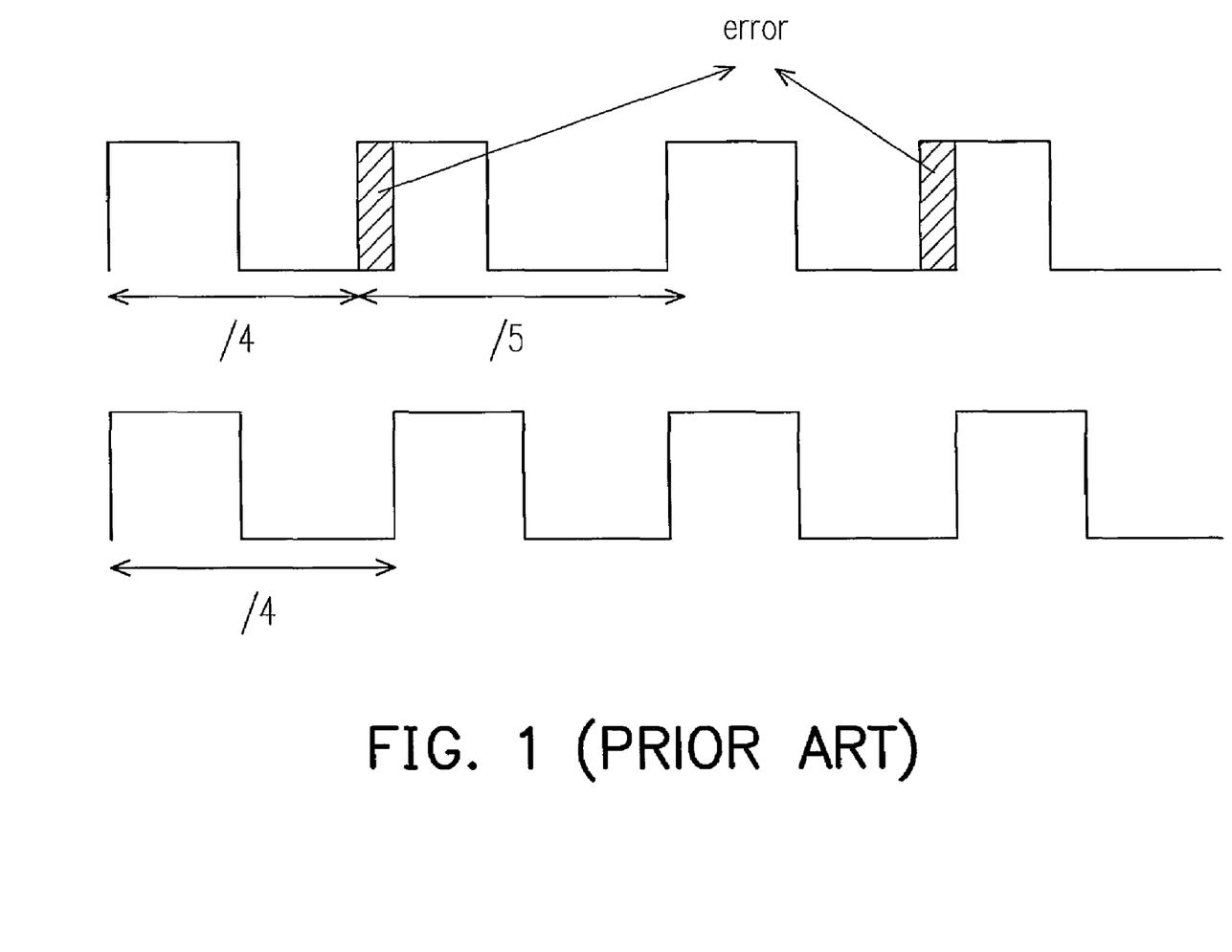
FIG. 1 is a schematic view illustrating errors occurring when an integer frequency divider is employed to perform a fractional frequency division.

Quantization errors inevitably occur when a fractional frequency division is performed by an integer frequency divider. FIG. 1 is a schematic view illustrating errors occurring when the integer frequency divider (e.g. dividing by 4 or 5) is employed to perform the fractional frequency division (e.g. dividing by 4.5).

If the quantization error is pushed to high frequency side and then suppressed by the LPF, spur suppression can be desirably accomplished. However, a tradeoff is required between a bandwidth range and the capacity of spur suppression.

Figure 2A:
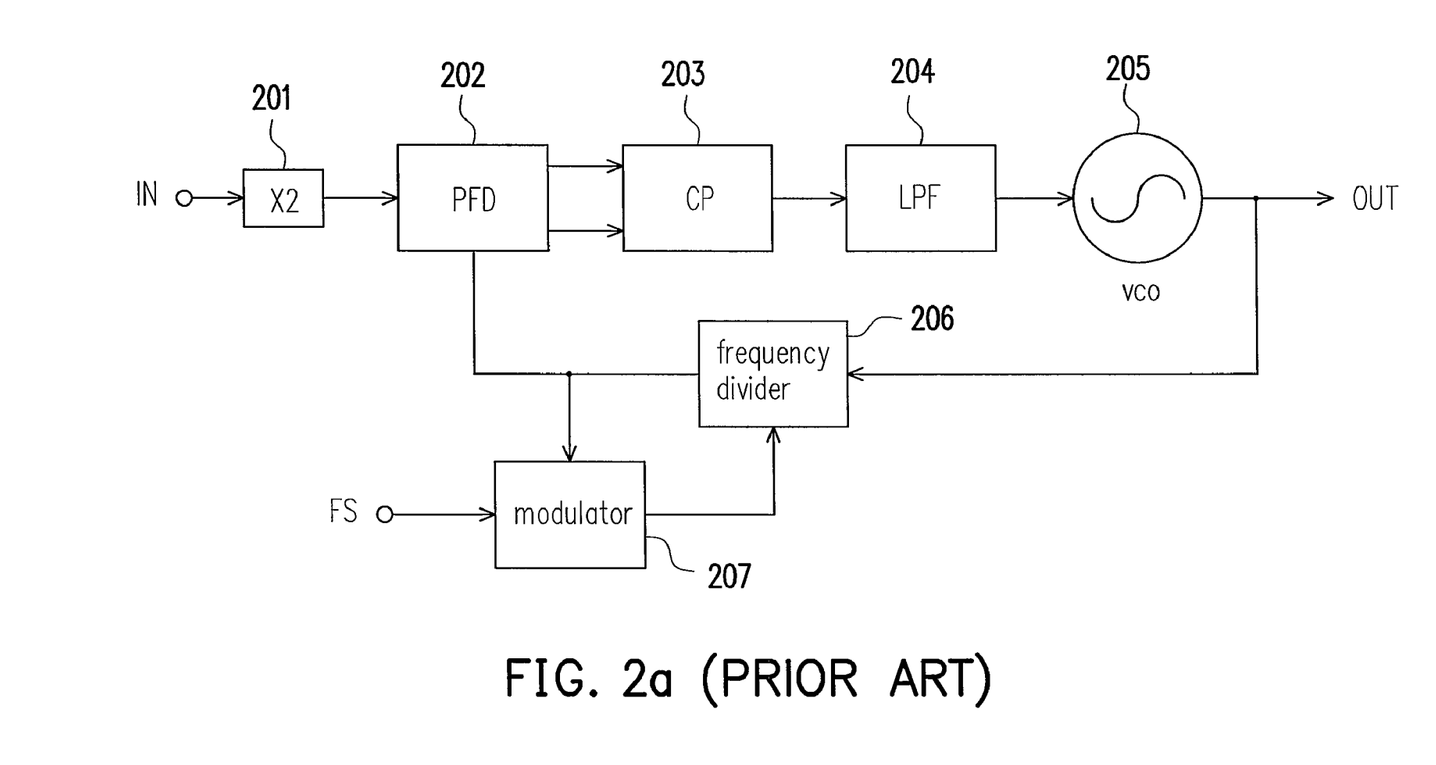
FIGS. 2a and 2b depict two conventional PLLs with use of multipliers and modulators for reducing the errors.
Figure 2B:
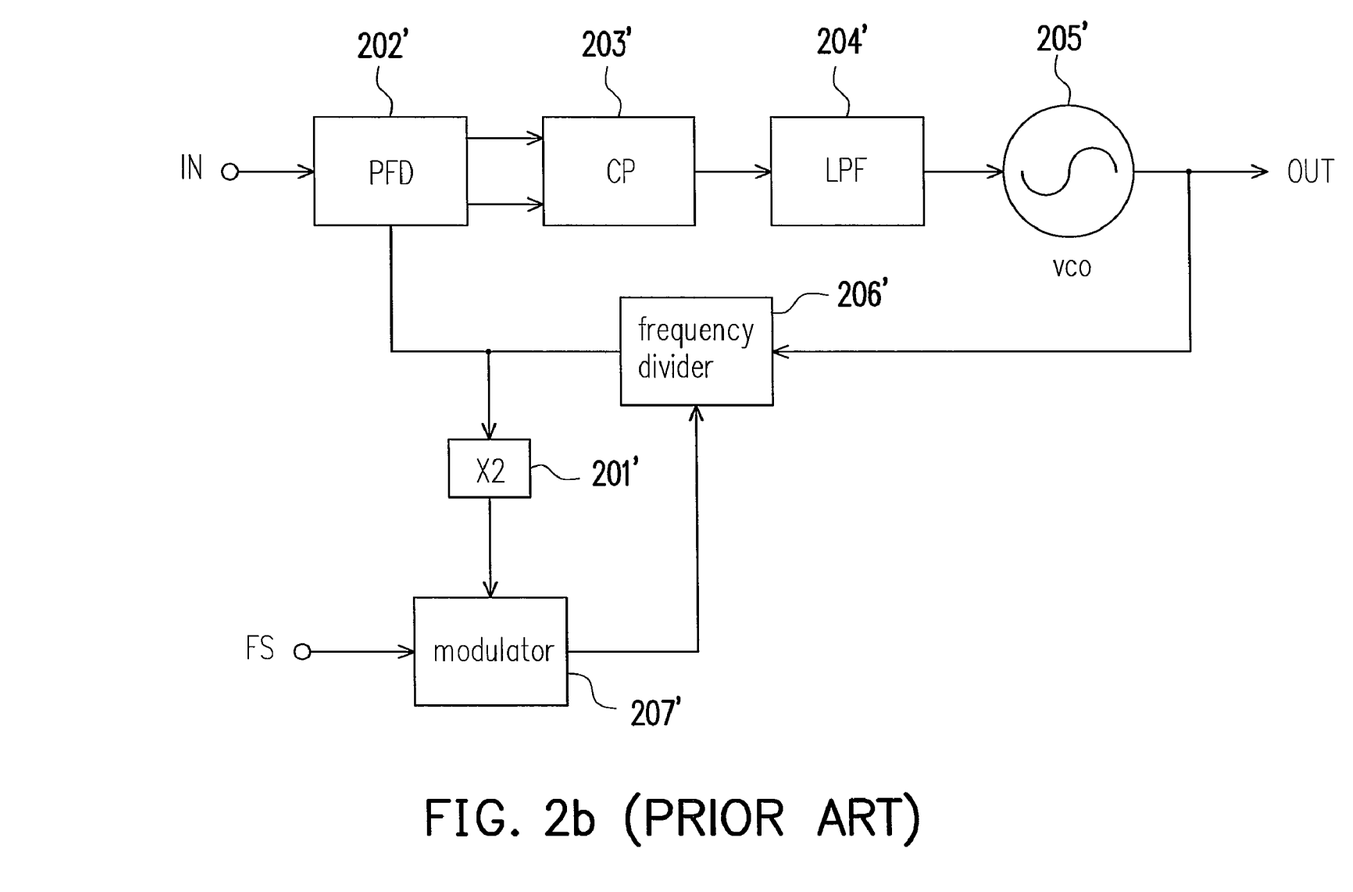

Currently, several conventional techniques using frequency multipliers and modulators (for example, a delta-sigma modulation (DSM)) have been developed to reduce the quantization errors. FIGS. 2a and 2b depict two conventional PLLs with use of the frequency multipliers and the modulators for error reduction.

Please refer to FIG. 2a. The first conventional PLL includes a frequency multiplier 201, a PFD 202, a CP 203, an LPF 204, a VCO 205, a frequency divider 206 and a modulator 207. Through the first conventional PLL, quantization errors are pushed to high frequency side, and a wider operation bandwidth is acquired, while the frequency resolution is reduced.

Please refer to FIG. 2b. The second conventional PLL includes a frequency multiplier 201', a PFD 202', a CP 203', an LPF 204', a VCO 205', a frequency divider 206', and a modulator 207'. A disadvantage of the second conventional PLL lies in that the output signal of the frequency divider 206' does not have 50% duty cycles, and an additional duty cycle correction circuit is necessitated. Moreover, modulus errors may occur.

SUMMARY OF THE INVENTION

The present invention is directed to a phase-locked loop (PLL) and a method of generating signals thereof, so as to broaden an operation range of a modulator therein.

The present invention is directed to a PLL and a method of generating signals thereof, so as to reduce quantization errors.

The present invention is directed to a PLL and a method of generating signals thereof, so as to reduce modulus of a frequency divider and to further suppress in-band spurs of the PLL.

The present invention is directed to a PLL and a method of generating signals thereof, so as to reduce spurs of an input signal.

The present invention provides a PLL including phase shifters shifting a phase of an input signal to generate shifted signals; phase frequency detectors (PFDs) which are coupled to the phase shifters and compare the phase of the input signal with the phase of a frequency division output signal and/or the phase of the shifted signals and the phase of the frequency division output signal to generate voltage control signals, wherein the PFDs perform the phase comparisons within a cycle of the input signal, and enabling periods of the PFDs are not overlapping with one another; charge pumps (CPs) which are coupled to the PFDs and control a node voltage in response to the voltage control signals; a voltage controlled oscillator (VCO) generating an output signal in response to the node voltage; a frequency divider dividing the frequency of the output signal from the VCO to generate the frequency division output signal; and a circulator which is coupled to the frequency divider and outputs the frequency division output signal to the PFDs.

The present invention further provides a method of generating signals. The method produces an output signal based on an input signal, including shifting a phase of the input signal so as to generate a first shifted signal; comparing the phase of the input signal with the phase of a frequency division output signal so as to generate a first voltage control signal; comparing the phase of the first shifted signal with the phase of the frequency division output signal so as to generate a second voltage control signal; in response to the first and the second voltage control signals, controlling a node voltage; in response to the node voltage, oscillating the output signal; dividing the frequency of the output signal to generate the frequency division output signal; and modulating the frequency division output signal so as to remove high frequency spurs of the frequency division output signal. Here, the steps of generating the first voltage control signal and of generating the second voltage control signal are not carried out simultaneously.

The present invention further provides an PLL, including a first phase shifter shifting a phase of an input signal; phase detectors, each of which generates a phase difference signal indicating a phase difference between an input signal and a feedback signal and/or the phase difference between the shifted signal and the feedback signal; charge pumps, each of which generates a charge pump output signal indicating the phase differences detected by the phase detectors; a filter transforming the charge pump output signals generated by the charge pumps to a frequency control voltage; a voltage controlled oscillator (VCO) generating an output signal of which the frequency is corresponding to the frequency control voltage; a frequency divider dividing the frequency of the output signal so as to generate the feedback signal; a selecting unit selectively transmitting the feedback signal generated by the frequency divider to the phase detectors; and a modulator, in response to a frequency selecting signal, modulating the feedback signal generated by the frequency divider, and transmitting the modulated result back to the frequency divider so as to reduce quantization errors thereof.

In order to make the aforementioned and other objects, features and advantages of the present invention comprehensible, a preferred embodiment accompanied with figures is described in detail below.

DESCRIPTION OF EMBODIMENTS

In order to make the present invention more comprehensible, embodiments are described below as the examples to prove that the invention can actually be realized.

Figure 3:
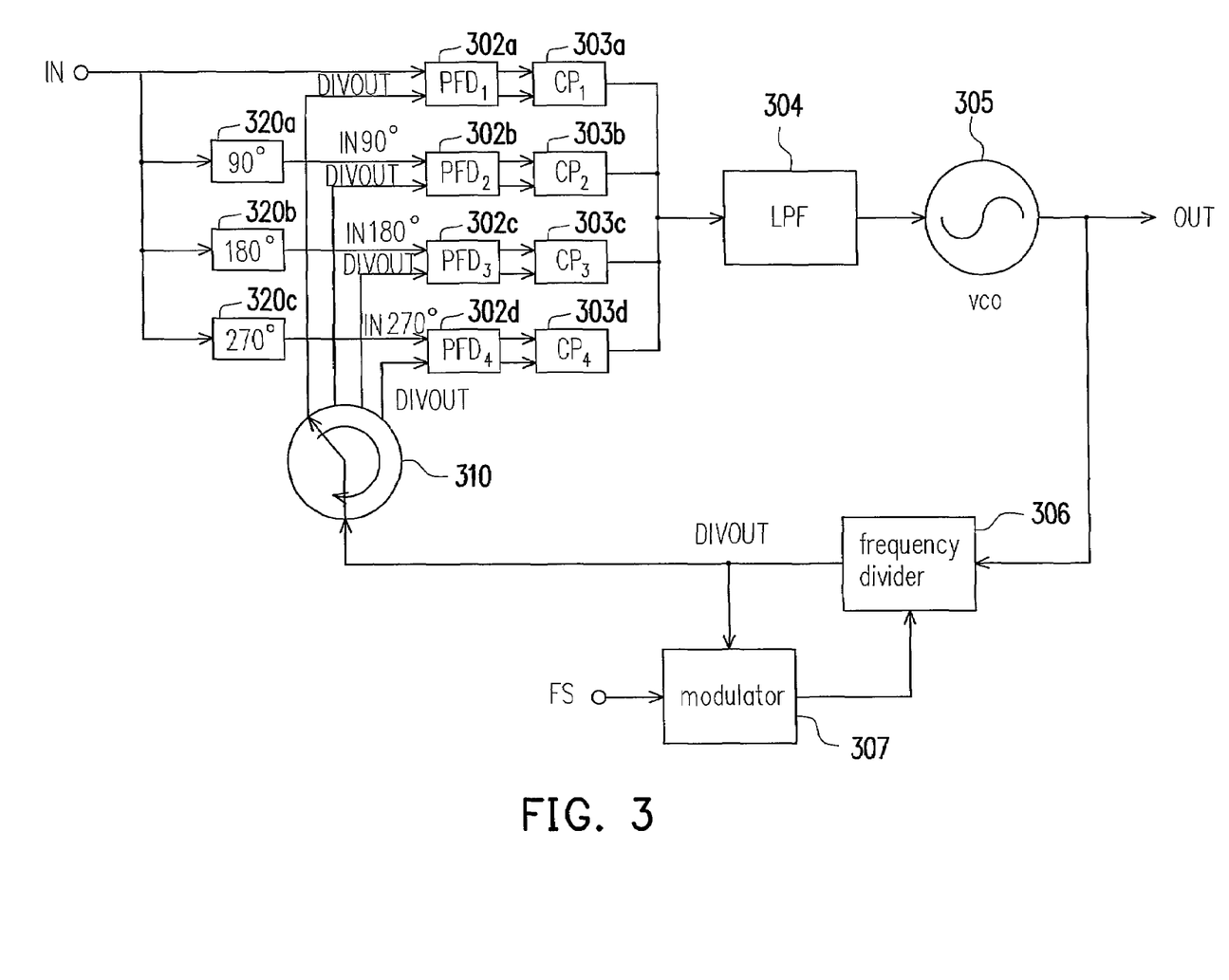
FIG. 3 is a circuit block diagram depicting a PLL according to one embodiment of the present invention.
Figure 4:
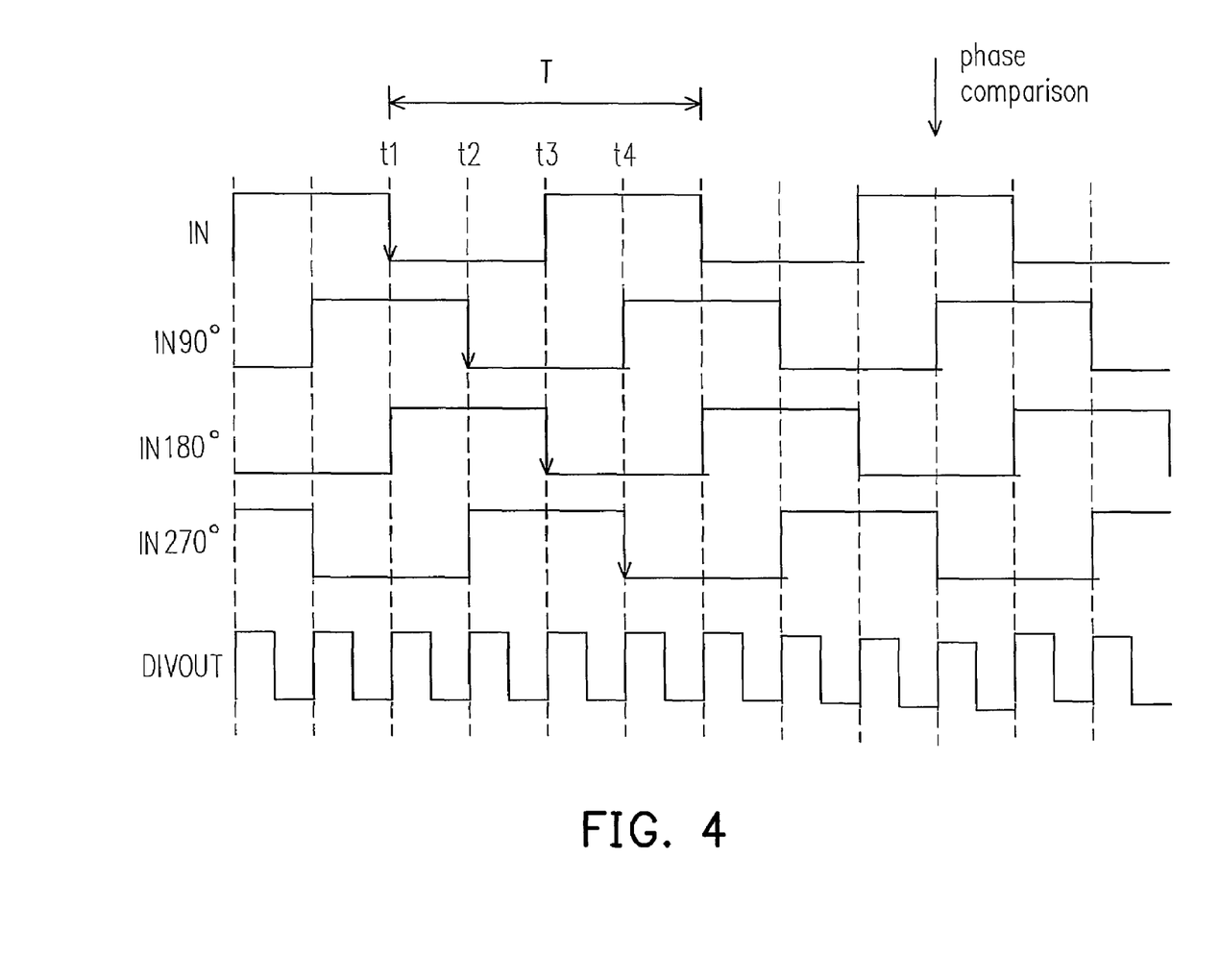
FIG. 4 is a timing chart depicting signals of the PLL.

FIG. 3 is a circuit block diagram depicting a PLL according to one embodiment of the present invention. FIG. 4 is a timing chart depicting signals of the PLL. Please refer to FIG. 3. According to one embodiment of the present invention, the PLL includes phase frequency detectors (PFDs) $302a$~$302d$, charge pumps (CPs) $303a$~$303d$, a low-pass filter (LPF) 304, a voltage controlled oscillator (VCO) 305, a frequency divider 306, a modulator 307, a circulator 310, and phase shifters $320a$~$320c$.

The phase shifters $320a$~$320c$ shift the phase of an input signal IN. Particularly, the phase shifter $320a$ performs a 90° phase shift on the input signal IN so as to generate a shifted signal IN90°. The phase shifter $320b$ performs a 180° phase shift on the input signal IN so as to generate another shifted signal IN180°. The phase shifter $320c$ performs a 270° phase shift on the input signal IN so as to generate still another shifted signal IN270°. Please refer to FIG. 4 for the phase relationship among the input signal IN, the shifted signals shifted IN90°, IN180°, and IN270°.

The circulator 310 selectively transmits an output signal DIVOUT of the frequency divider 306 to one of the PFDs $302a$~$302d$ at a proper timing. Please again refer to FIG. 4. The circulator 310 transmits the output signal DIVOUT of the frequency divider 306 to the PFD $302a$, such that the PFD $302a$ compares the signal IN with the output signal DIVOUT at timing t1. The circulator 310 transmits the output signal DIVOUT of the frequency divider 306 to the PFD $302b$, such that the PFD $302b$ compares the signal IN90° with the output signal DIVOUT at timing t2. The circulator 310 transmits the output signal DIVOUT of the frequency divider 306 to the PFD $302c$, such that the PFD $302c$ compares the signal IN180° with the output signal DIVOUT at timing t3. The circulator 310 transmits the output signal DIVOUT of the frequency divider 306 to the PFD $302d$, such that the PFD $302d$ compares the signal IN270° with the output signal DIVOUT at timing t4. The circulator 310 can be regarded as a specialized multiplexer.

The PFD $302a$ compares the signal IN with the output signal DIVOUT so as to obtain a control signal for controlling the CP $303a$. The PFD $302b$ compares the signal IN90° with the output signal DIVOUT so as to obtain another control signal for controlling the CP $303b$. The PFD $302c$ compares the signal IN180° with the output signal DIVOUT so as to obtain still another control signal for controlling the CP $303c$. The PFD $302d$ compares the signal IN270° with the output signal DIVOUT so as to obtain yet still another control signal for controlling the CP $303d$. For the purpose of power saving, it is desired to enable the PFDs $302a$~$302d$ just before the phase frequency detection is to be performed. Alternatively, the enabling cycles of the PFDs $302a$~$302d$ are not or barely overlapping with one another.

In accordance with the control signals outputted by the PFDs $302a$~$302d$, the CPs $303a$~$303d$ determine if the output voltages of the CPs $303a$~$303d$ are increased or decreased.

The LPF 304 is capable of filtering high frequency spurs of the output voltages of the CPs $303a$~$303d$.

The VCO 305 receives said filtered output voltages from the CPs $303a$~$303d$ and generates an output signal OUT of the PLL based on the filtered output voltages. The output signal OUT is transmitted back to the frequency divider 306.

The frequency divider 306 divides the frequency of the output signal OUT from the VCO 305 so as to generate the output signal DIVOUT. The output signal DIVOUT is inputted to the circulator 310 and the modulator 307. According to the present embodiment, the frequency divider 306 may be an integer frequency divider or a fractional frequency divider. However, the architecture of the frequency divider 306 is not limited in the present embodiment. The main concern here lies in an achievement of the performance of said frequency divider 306.

Based on a frequency selecting signal FS, the modulator 307 modulates the output signal DIVOUT and feeds the modulated result back to the frequency divider 306. In particular, the modulator 307 pushes the quantization errors of the output signal DIVOUT to higher frequency side, so as to filter the high frequency quantization errors with use of an internal LPF (not shown).

Please again refer to FIG. 4. T represents a cycle of the input signal IN, and t1~t4 represent the timing at which the phase frequency detection is performed. As shown in FIG. 4, the phase frequency detection is performed for four times during one cycle T according to the present embodiment. Thereby, the accuracy of detecting the phase frequency can be guaranteed.

Moreover, the PFDs $302a$~$302d$ can be replaced by phase detectors so as to perform phase comparisons among the signals. Furthermore, given that the CPs or/and the PFDs (or the phase detectors) are at sufficient operating speeds, the amount of the CPs or/and the PFDs (or the phase detectors) can be reduced upon consideration according to other embodiments, such that the power consumption and the circuit area are decreased.

Figure 5:
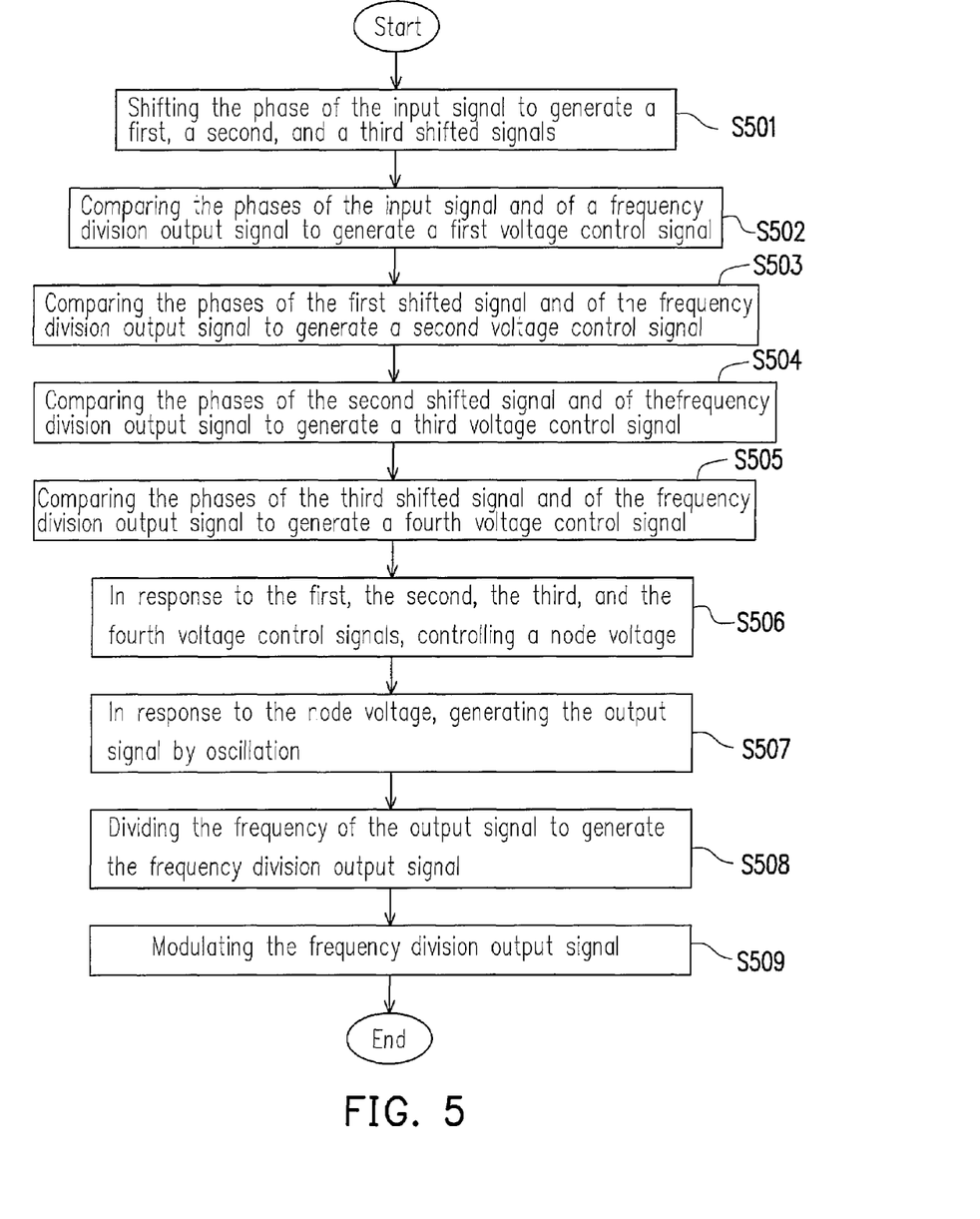
FIG. 5 is a flow chart depicting another embodiment of the present invention.

FIG. 5 is a flow chart illustrating a method of generating signals according to another embodiment of the present invention. With reference to step S501 in FIG. 5, the phase of the input signal is shifted so as to generate a first, a second, and a third shifted signals. For example, a 90° phase shift, a 180° phase shift, and a 270° phase shift are performed on the input signal so as to generate the first, the second, and the third shifted signals. Step S501 can be performed with use of the phase shifters, for example.

With reference to step S502, the phases of the input signal and of a frequency division output signal are compared so as to generate a first voltage control signal. With reference to step S503, the phases of the first shifted signal and of the frequency division output signal are compared so as to generate a second voltage control signal. With reference to step S504, the phases of the second shifted signal and of the frequency division output signal are compared so as to generate a third voltage control signal. With reference to step S505, the phases of the third shifted signal and of the frequency division output signal are compared so as to generate a fourth voltage control signal. Steps S502~S505 can be performed with use of the phase detectors or the PFDs, for example.

With reference to step S506, in response to the first, the second, the third, and the fourth voltage control signals, a node voltage is controlled. Step S506 can be performed with use of the CPs, for example, and the node voltage may be the output voltage of the CPs.

With reference to step S507, in response to the node voltage, the output signal is generated by oscillation, for example. Step S507 can be performed with use of the VCO, for example.

With reference to step S508, the frequency of the output signal is divided so as to generate the frequency division output signal. Step S508 can be performed with use of the frequency divider, for example. In addition, the frequency divider may be the integer frequency divider or the fractional frequency divider.

With reference to step S509, the frequency division output signal is modulated. Step S509 can be performed with use of the DSM, for example.

In view of the foregoing, the above embodiments at least include the following advantages of (1) broadening the operation range of the modulator; (2) pushing the quantization errors to high frequency side; (3) reducing the modulus of the frequency divider and suppressing the in-band spurs of the PLL; and (4) pushing the spurs at the input terminal to high frequency side and suppressing the spurs with use of the LPF.

The present embodiment can be applied to computer systems or communication systems which adopt reference clock signals with various frequencies.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A phase locked loop (PLL), comprising:
a plurality of phase shifters, shifting a phase of an input signal so as to generate a plurality of shifted signals;
a plurality of phase frequency detectors (PFDs), coupled to the phase shifters, the PFDs comparing the phase of the input signal with the phase of a frequency division output signal or comparing the phase of the shifted signals with the phase of the frequency division output signal to generate a plurality of voltage control signals, wherein the PFDs perform phase comparisons within a cycle of the input signal;
a plurality of charge pumps (CPs), coupled to the PFDs, in response to the voltage control signals, the CPs controlling a node voltage;
a voltage controlled oscillator (VCO), in response to the node voltage, the VCO oscillating and generating an output signal;
a frequency divider, dividing the frequency of the output signal from the VCO so as to generate the frequency division output signal; and
a circulator, coupled to the frequency divider, the circulator selectively outputting the frequency division output signal to the PFDs.

2. The PLL of claim 1, further comprising:
a low-pass filter (LPF) coupled to the CPs, the LPF performing a low-pass filtering operation on the node voltage.

3. The PLL of claim 1, further comprising:
a modulator coupled to the frequency divider, the modulator modulating the frequency division output signal so as to reduce quantization errors.

4. The PLL of claim 1, wherein the phase shifters comprise:
a first phase shifter performing a 90° phase shift on the input signal so as to generate a first shifted signal;
a second phase shifter performing a 180° phase shift on the input signal so as to generate a second shifted signal; and
a third phase shifter performing a 270° phase shift on the input signal so as to generate a third shifted signal.

5. The PLL of claim 4, wherein the PFDs comprise:
a first PFD comparing the input signal with the frequency division output signal so as to generate a first voltage control signal;
a second PFD comparing the first shifted signal with the frequency division output signal so as to generate a second voltage control signal;
a third PFD comparing the second shifted signal with the frequency division output signal so as to generate a third voltage control signal; and
a fourth PFD comparing the third shifted signal with the frequency division output signal so as to generate a fourth voltage control signal.

6. The PLL of claim 5, wherein the CPs comprise:
a first CP, in response to the first voltage control signal, the first CP controlling the node voltage;
a second CP, in response to the second voltage control signal, the second CP controlling the node voltage;
a third CP, in response to the third voltage control signal, the third CP controlling the node voltage; and
a fourth CP, in response to the fourth voltage control signal, the fourth CP controlling the node voltage.

7. A signal generation method for generating an output signal based on an input signal, the method comprising:
shifting a phase of the input signal so as to generate a first shifted signal;
comparing the phase of the input signal with the phase of a frequency division output signal so as to generate a first voltage control signal;
comparing the phase of the first shifted signal with the phase of the frequency division output signal so as to generate a second voltage control signal;
in response to the first and the second voltage control signals, controlling a node voltage;
in response to the node voltage, generating the output signal by oscillation;
dividing the frequency of the output signal so as to generate the frequency division output signal; and
modulating the frequency division output signal so as to remove high frequency spurs of the frequency division output signal, wherein the steps of generating the first voltage control signal and of generating the second voltage control signal are not carried out simultaneously.

8. The method of claim 7, further comprising:
shifting the phase of the input signal so as to generate a second and a third shifted signals.

9. The method of claim 8, further comprising:
comparing the phase of the second shifted signal with the phase of the frequency division output signal so as to generate a third voltage control signal; and
comparing the phase of the third shifted signal with the phase of the frequency division output signal so as to generate a fourth voltage control signal.

10. The method of claim 9, further comprising:
in response to the third and the fourth voltage control signals, controlling the node voltage.

11. The method of claim 7, wherein the frequency division step comprises:
performing a fractional frequency division on the output signal so as to generate the frequency division output signal.

12. The method of claim 7, wherein the modulating step comprises:
performing a delta-sigma modulation (DSM) on the frequency division output signal.

13. The method of claim 7, further comprising:
performing a low-pass filtering operation on the node voltage.

14. A phase locked loop, comprising:
a first phase shifter shifting a phase of an input signal;
a plurality of phase detectors, each of which generating a phase difference signal indicating a phase difference between an input signal and a feedback signal or a phase difference between the shifted signal and the feedback signal;
a plurality of charge pumps, each of which generating a charge pump output signal corresponding to each of the phase difference signals;
a filter transforming the charge pump output signals generated by the charge pumps into a frequency control voltage;
a voltage controlled oscillator generating an output signal of which the frequency being corresponding to the frequency control voltage;
a frequency divider dividing the frequency of the output signal so as to generate the feedback signal;
a selecting unit selectively transmitting the feedback signal generated by the frequency divider to the phase detectors; and
a modulator, in response to a frequency selecting signal, the modulator modulating the feedback signal generated by the frequency divider, and feeding the modulation result back to the frequency divider so as to reduce quantization errors thereof.

15. The PLL of claim 14, further comprising:
a second phase shifter shifting the phase of the input signal; and
a third phase shifter shifting the phase of the input signal.

16. The PLL of claim 15, wherein the PFDs comprise:
a first PFD comparing the input signal with the feedback signal so as to generate the phase difference signal;
a second PFD comparing an output signal of the first phase shifter with the feedback signal so as to generate the phase difference signal;
a third PFD comparing an output signal of the second phase shifter with the feedback signal so as to generate the phase difference signal; and
a fourth PFD comparing an output signal of the third phase shifter with the feedback signal so as to generate the phase difference signal.

17. The PLL of claim 16, wherein the CPs comprise:
a first CP, in response to the phase difference signal generated by the first PFD, the first CP generating the charge pump output signal;
a second CP, in response to the phase difference signal generated by the second PFD, the second CP generating the charge pump output signal;
a third CP, in response to the phase difference signal generated by the third PFD, the third CP generating the charge pump output signal; and
a fourth CP, in response to the phase difference signal generated by the fourth PFD, the fourth CP generating the charge pump output signal.

18. The PLL of claim 14, wherein the filter comprises an LPF.

19. The PLL of claim 14, wherein the modulator comprises a DSM.

* * * * *